(12) United States Patent
Kwok

(10) Patent No.: US 10,163,471 B2
(45) Date of Patent: Dec. 25, 2018

(54) TIME TRACKING WITH TRITS

(71) Applicant: INTEL CORPORATION

(72) Inventor: Zion S. Kwok, Vancouver (CA)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/474,659

(22) Filed: Mar. 30, 2017

(65) Prior Publication Data

US 2018/0286469 A1  Oct. 4, 2018

(51) Int. Cl.
*G11C 7/22* (2006.01)

(52) U.S. Cl.
CPC ........................ *G11C 7/22* (2013.01)

(58) Field of Classification Search
CPC ........................................................ G11C 7/22
See application file for complete search history.

(56) References Cited

U.S. PATENT DOCUMENTS

| | | | |
|---|---|---|---|
| 6,732,307 B1* | 5/2004 | Edwards | G06F 11/3636 714/45 |
| 9,934,859 B1 | 4/2018 | Swaminathan et al. | |
| 2011/0170349 A1 | 7/2011 | Avraham et al. | |
| 2015/0179274 A1* | 6/2015 | Kim | G11C 16/3418 711/103 |
| 2015/0332780 A1 | 11/2015 | Jang et al. | |
| 2016/0004437 A1* | 1/2016 | Kim | G11C 29/021 714/764 |
| 2016/0087646 A1* | 3/2016 | Motwani | H03M 7/02 708/204 |

OTHER PUBLICATIONS

U.S. Appl. No. 15/391,763, filed Dec. 27, 2016.
Office Action issued in U.S. Appl. No. 15/391,763, dated Jun. 21, 2017, 9 pages.
Notice of Allowance issued in U.S. Appl. No. 15/391,763,, dated Nov. 27, 2017, 5 pages.

* cited by examiner

*Primary Examiner* — Pho M Luu
*Assistant Examiner* — Jerome Leboeuf
(74) *Attorney, Agent, or Firm* — Grossman, Tucker, Perreault & Pfleger, PLLC

(57) ABSTRACT

A memory controller circuitry includes a timestamp circuitry and a demarcation voltage (VDM) selection circuitry. The timestamp circuitry is to capture a global timer index from a global timer having a granularity, G. The timestamp circuitry is further to fetch a timestamp for a memory block that includes a group of sub-blocks that includes a target sub-block. The demarcation voltage (VDM) selection circuitry is to fetch a combined count from a count store. The combined count represents a combined state. The combined state includes a target individual state of the target sub-block and a respective individual state of each of at least one other sub-block of the group of sub-blocks included in the memory block.

21 Claims, 5 Drawing Sheets

300

```
Capture timer index ("index") 302
        ↓
Fetch timestamp for the block X that includes SBy   304
        ↓
Fetch composite count for the group that contains SBy   306
        ↓
Expand composite count to composite state   308
        ↓
Set trit corresponding to SBy to zero   310
        ↓
Is timestamp equal to index?   312
```

- YES → (to Reduce step)
- NO → Increment any trits in composite state that are <2   314 → Update timestamp   316

Reduce updated composite state to updated composite count   318
↓
Store updated composite count to count store   320
↓
Continue   322

TIME TRACKING WITH TRITS

FIELD

The present disclosure relates to time tracking, in particular to, time tracking with trits.

BACKGROUND

Volatile memory is configured to maintain stored information while powered. Non-volatile memory (NVM) may retain stored information after power is removed and the stored information may thus be available if power is again applied. Some types of NVM may utilize a read reference voltage for reading a memory cell. For example, a demarcation voltage (VDM) may be externally applied to a memory cell as a read reference voltage. The memory cells may be characterized by an associated threshold voltage (Vt), which indicates the minimum voltage at which the memory cell may allow current to flow. When a read reference voltage is applied to a target memory, an absence of current flow may be read as a logic one and a non-zero current flow may be read as a logic zero (or vice versa).

BRIEF DESCRIPTION OF DRAWINGS

Features and advantages of the claimed subject matter will be apparent from the following detailed description of embodiments consistent therewith, which description should be considered with reference to the accompanying drawings, wherein:

FIG. 3 is a flowchart of time tracking write operations according to various embodiments of the present disclosure;

Figure 1:
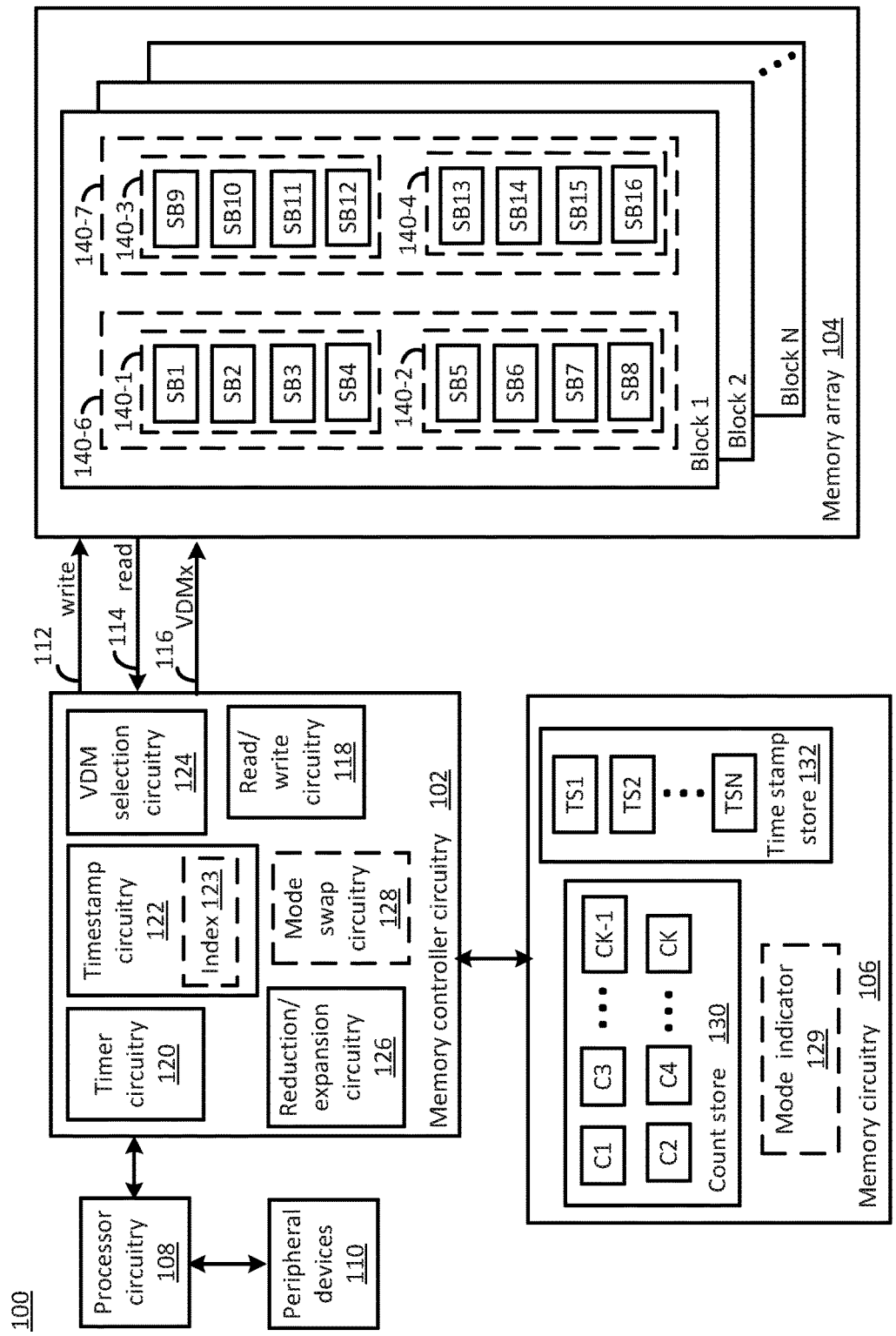
FIG. 1 illustrates a functional block diagram of a time tracking system consistent with several embodiments of the present disclosure.

Although the following Detailed Description will proceed with reference being made to illustrative embodiments, many alternatives, modifications, and variations thereof will be apparent to those skilled in the art.

DETAILED DESCRIPTION

In some NVM technologies, the Vt may drift over time. A drift time interval for a memory cell may be measured from a last (i.e., most recent) write operation to a read operation. The respective ranges of memory cell threshold voltages that are associated with logic one or logic zero will change when their threshold voltages drift. Thus, a first VDM may be appropriate for a read operation relatively near in time to a write operation and a second VDM may be appropriate for a read operation relatively distant in time from the write operation. Accurately reading a target memory cell relies on applying an appropriate read reference voltage. A read operation may occur at any time relative to a write operation.

Generally, an NVM memory array may include on the order of ones, tens, hundreds, or more gigabytes (GB) of storage. The NVM memory array may be arranged in blocks and each block may include a plurality of sub-blocks. Each sub-block may include a plurality of memory cells and each sub-block may correspond to a write unit having a minimum write granularity. Thus, a sub-block corresponds to a minimum number of memory cells that are accessed during a write operation. For example, a block may include 16 sub-blocks and each sub-block may include 512 bytes, thus the block may include 8 kilobytes (kB) of storage. Continuing with this example, a 10 GB NVM may include about 1.25 million blocks and about 20 million sub-blocks.

A value of a demarcation voltage (VDM) for a read of a selected memory cell may be related to a time interval since a most recent write operation to the sub-block that contains the selected memory cell. For example, NVM memory cells may be read utilizing one of two demarcation voltages VDM1 or VDM2 as read reference voltages. VDM1 may be utilized to relatively reliably read a target memory cell relatively close in time (e.g., less than one second) to a most recent write to the sub-block that includes the target memory cell. VDM2 may be utilized to relatively reliably read the target memory cell at a time that is not relatively close in time to the most recent write. Utilizing VDM1 to read the target memory cell at a time that is not relatively close to the most recent write may not always be successful. Utilizing VDM2 to read the target memory cell at a time that is relatively close in time to the most recent write to the sub-block may corrupt data stored to the sub-block.

In some situations, in response to a read request for a target memory cell, a time interval duration since a most recent write to a target sub-block that includes the target memory cell may be determined. The time interval duration may then be utilized to select between VDM1 or VDM2. The time interval duration may be determined based, at least in part, on a timestamp corresponding to the most recent write to the sub-block. The timestamp may be stored, for example, in volatile memory (e.g., dynamic random access memory (DRAM)). A 10 GB memory array may thus have a corresponding 20 million timestamps (e.g., one timestamp for each sub-block) stored to DRAM. Storing each timestamp may thus consume volatile memory. For example, a 32-bit timestamp may consume 80 million bytes of DRAM.

Generally, this disclosure relates to time tracking using trits. Analogous to a bit, a trit (trinary digit) is a ternary digit. One trit is equivalent to log 23 (about 1.58496) bits of information. An apparatus, method and/or system are configured to determine a current elapsed time for a sub-block since a most recent write to a corresponding block that contains the sub-block. The current elapsed time may be determined based, at least in part, on a current timer index, a timestamp and an individual state associated with the sub-block. The timer has a time interval duration, i.e., a granularity, G.

The timestamp is associated with the block and may correspond to a timer index of the most recent write to any sub-block contained in the block. The individual state of a given sub-block is configured to indicate a time interval duration from a most recent write to the sub-block to a most recent write to any sub-block contained in the block. The individual state may be limited to a time duration of two clock periods of the timer. Utilizing individual states is configured to facilitate utilizing a respective timestamp for each block and thus, the one timestamp for a plurality of sub-blocks. Utilizing one timestamp for a block is configured to reduce an amount of storage occupied by timestamps. Utilizing the individual states is configured to ensure adequate accuracy of an elapsed time determination and associated selection of an appropriate VDM for a read operation for a relatively coarse timer granularity.

In some embodiments, the time tracking may be full state. As used herein, "full state" means each individual state may have three possible values, e.g., 0, 1, 2. In some embodiments, the time tracking may utilize condensed states. As used herein, condensed state means each individual state may have two possible values, e.g., 0 and 1. In the condensed state, the full state values 0 and 1 may be condensed into condensed state value 0 and the full state value 2 may correspond to the condensed state value 1.

Each full state may be represented by a ternary digit, i.e., a trit. Each condensed state may be represented by a binary digit, i.e., a bit. Each full state and/or each condensed state may be associated with a respective sub-block included in a block.

A plurality of individual states may be combined into a combined state. For example, a plurality of full state values may be combined into a composite state. The composite state may include a plurality of concatenated trits with each trit representing an individual full state of a respective sub-block. A number, N1, of trits included in a composite state may thus correspond to N1 individual states and the composite state may further correspond to a group of N1 sub-blocks. In another example, a plurality of condensed state values may be combined into a compressed state. The compressed state may include a plurality of concatenated bits with each bit representing an individual condensed state of a respective sub-block. A compressed state that includes N1 bits corresponding to N1 condensed states may further correspond to a group of N1 sub-blocks.

A maximum value represented by an unsigned binary number having a number, n, digits is $2^n-1$. Similarly, a maximum value represented by an unsigned ternary number having a number, m, digits is $3^m-1$. For example, a maximum ternary number having four digits is $2222_3$ which is equivalent to decimal number 80 and to the binary number 1010000<sub>2</sub>. Thus, a four digit ternary number may be represented by a seven digit binary number. Similarly, an eight digit ternary number ($3^8-1=6560$, maximum) may be represented by a 13 bit binary number ($2^{13}-1=8191$, maximum).

The composite state may be converted into a binary composite count. For example, for a composite state that includes N1 trits, the composite binary count may include a number, N2, bits. The number of bits, N2, is less than two times the number, N1, of trits. For example, N1 may be equal to 4 and N2 may be equal to 7. In another example, N1 may be equal to 8 and N2 may be equal to 13. In other words, converting the composite state to the composite count is configured to reduce an amount of storage occupied by representations of sub-block states. A composite count may thus represent a composite state.

The compressed state corresponds to a binary compressed count. The compressed count may include the number N1 bits with each bit corresponding to a respective individual condensed state. Thus, N1 bits may correspond to N1 sub-blocks. The compressed count may thus represent the compressed state. Utilizing a compressed count (and condensed individual state) is configured to trade-off precision for a decrease in an amount of storage occupied by combined counts, as will be described in more detail below.

A time interval ("overlap interval") since a most recent write may be defined where both VDM1 and VDM2 provide a relatively accurate read result without corrupting data stored in the sub-block. A lower bound of the overlap interval corresponds to a minimum actual time associated with VDM2 (VDM2Tmin) and an upper bound of the overlap interval corresponds to a maximum actual time associated with VDM1 (VDM1Tmax). VDM2 may be safely used for actual times greater than VDM2Tmin. VDM1 may provide a relatively reliable read result for actual times less than VDM1Tmax. Thus, VDM1 or VDM2 may be safely used during the overlap interval.

Outside the overlap interval, VDM1 may be safely used during a time interval with a duration less than VDM2Tmin and VDM2 may be safely used during a time interval with duration greater than VDM1Tmax. The overlap interval may facilitate utilizing a timer circuitry having a relatively coarse granularity to determine an elapsed time, as will be described in more detail below. Thus, an elapsed time since a most recent write operation to a sub-block may be used to select an appropriate demarcation voltage, e.g., VDM1 or VDM2, for a read operation.

A timer circuitry may be configured to provide a periodic clock signal that has a period, G. Each sequential period may be identified by a respective timer index, e.g., 0, 1, 2, 3, . . . , M−1. The timer circuitry is configured to be relatively accurate but with a relatively coarse granularity, i.e., a relatively coarse period, G. In one example, G may be in the range of 1 microsecond to 1 year. In another example, G may be in the range of 0.1 second to 100 seconds. Utilizing the relatively coarse granularity is configured to reduce an amount of storage consumed by stored timestamps. The granularity may be constrained and/or may be related to VDM2Tmin and/or VDM1Tmax. In an embodiment, the granularity, G, may be greater than VDM2Tmin and 2*G may be less than VDM1Tmax. Thus, for a read operation at an actual time from a most recent write that is between G and 2G, VDM1 or VDM2 may be safely used.

In operation, in response to a write operation to a sub-block, the current timer index may be captured. The current timer index may then correspond to a timestamp of the write operation. The timestamp may be associated with the block that includes the sub-block and stored to a timestamp store. The individual state of the sub-block may be set to zero in response to the write. The individual state of the sub-block may be incremented in response to subsequent writes to other sub-blocks included in the block, if the corresponding timestamp changes in response to the write and the state of the sub-block is less than a threshold, e.g. 2. In other words, if two writes occur during a same timer period so that the captured timestamp is the same for the two writes, the state of the first written to sub-block is configured to remain unchanged in response to the write to the second sub-block. Retaining the state of the first written to sub-block unchanged in response to a write to a second associated sub-block during the same timer interval is configured to ensure that a determined minimum actual time for each sub-block is greater than VDM2Tmin. In other words, two writes to two sub-blocks included in the same block, that occur during the same timer period, may introduce an ambiguity in the elapsed time determinations partly due to the granularity of the timer. Constraining incrementing of corresponding states to situations where the associated timestamp changes is configured to manage this ambiguity.

In response to a read request to a target memory cell, an elapsed time since a most recent write to a sub-block that includes the target memory cell may be determined. For example, the elapsed time may be determined as:

elapsed time=current timer index−timestamp for the block that contains the target sub-block+individual state of the target sub-block.

The actual time associated with an elapsed time may have a range of values. For example, an elapsed time equal to one corresponds to an actual time of greater than zero and less than 2*G. In another example, an elapsed time equal to two corresponds to an actual time of greater than G. Since an individual state has a maximum value of two, an actual time difference between a most recent write of a sub-block and a most recent write of any sub-block in the block when the individual state is two, is at least G. Thus, an elapsed time equal to two may correspond to an arbitrarily large actual time. Thus, to ensure an actual time of at least G (and at least VDM2Tmin), a threshold of two may correspond to a minimum elapsed time. The ambiguity in minimum actual time is related to the granularity, G.

The timer index may wrap around to 0, as described herein. In the elapsed time determination, the difference of (the current timer index) minus (the timestamp for the block that contains the target sub-block) may be interpreted as a non-negative value between 0 and M−1. In practical implementations, the current timer index and the timestamp for the block that contains the target sub-block may be represented with two integers with log 2M bits each, where M is a power of 2. The difference between the index and the timestamp may then be truncated to log 2M bits to yield a non-negative value between 0 and M−1. In another example, this non-negative value (index−timestamp) may be obtained by performing a modulo operation as:

elapsed time=(current timer index−timestamp for the block that contains the target sub-block+M) modulo M+individual state of the target sub-block.

The individual state of the target sub-block may be determined based, at least in part, on a stored count. If the elapsed time is greater than or equal to the minimum elapsed time, then VDM2 may be selected as the read reference voltage. If the elapsed time is less than the minimum elapsed time, then VDM1 may be selected as the read reference voltage.

Thus, a timer index, a timestamp and a composite count or compressed count may be utilized to determine whether a minimum elapsed time (and corresponding minimum actual time) has been reached between a most recent write operation and a current read operation. If the minimum elapsed time has been reached, then VDM2 may be selected for the read operation. If the minimum elapsed time has not been reached, then VDM1 may be selected for the read operation. The minimum elapsed time corresponds to an actual time greater than VDM2Tmin.

In one example, the timer index may have possible values between 0 and 31, i.e., 5 bits. Each timestamp may thus have 5 bits. Respective combined states for each N1 sub-blocks may have N1 bits or N2 bits where N2<2*N1. Thus, an amount of storage occupied by time tracking information may be reduced compared to storing individual timestamps for each sub-block.

FIG. 1 illustrates a functional block diagram of a time tracking system 100 consistent with several embodiments of the present disclosure. System 100 may include a memory controller circuitry 102, a memory array 104, a memory circuitry 106, processor circuitry 108 and peripheral devices 110. Memory circuitry 106 may include volatile random-access memory, e.g., dynamic random access memory (DRAM), static random access memory (SRAM), etc. For example, processor circuitry 108 may correspond to a single core or a multi-core general purpose processor, such as those provided by Intel® Corp., etc. Peripheral device(s) 110 may include, but are not limited to, an external storage device (e.g., a hard disk drive (HDD), a solid-state drive (SDD)), a user interface (e.g., a keyboard, a mouse, a display, a touch sensitive display, etc.), etc.

Memory array 104 may be a non-volatile memory, e.g., a storage medium that does not require power to maintain the state of data stored by the storage medium. Nonvolatile memory may include, but is not limited to, a NAND flash memory (e.g., a Triple Level Cell (TLC) NAND or any other type of NAND (e.g., Single Level Cell (SLC), Multi Level Cell (MLC), Quad Level Cell (QLC), etc.)), NOR memory, solid state memory (e.g., planar or three Dimensional (3D) NAND flash memory or NOR flash memory), storage devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), byte addressable random accessible 3D crosspoint memory, ferroelectric transistor random access memory (Fe-TRAM), magnetoresistive random access memory (MRAM), phase change memory (PCM, PRAM), resistive memory, ferroelectric memory (F-RAM, FeRAM), spin-transfer torque memory (STT), thermal assisted switching memory (TAS), millipede memory, floating junction gate memory (FJG RAM), magnetic tunnel junction (MTJ) memory, electrochemical cells (ECM) memory, binary oxide filament cell memory, interfacial switching memory, battery-backed RAM, ovonic memory, nanowire memory, electrically erasable programmable read-only memory (EEPROM), etc. In some embodiments, the byte addressable random accessible 3D crosspoint memory may include a transistor-less stackable cross point architecture in which memory cells sit at the intersection of words lines and bit lines and are individually addressable and in which bit storage is based on a change in bulk resistance.

Memory array 104 may include a plurality of blocks Block 1, Block 2 . . . , Block N. For example, each block may include 4096 bytes (i.e., 4 kilobytes (kB)), 8192 bytes (i.e., 8 kB) or 16384 bytes (i.e., 16 kB) of storage. In other examples, each block may include more or fewer bytes of storage. Each block includes a plurality of sub-blocks. For example, Block 1 includes sub-blocks SB 1, SB 2, . . . , SB 16. In other examples, each block Block 1, Block 2 . . . , Block N may include more than 16 sub-blocks or fewer than 16 sub-blocks. Each sub-block may include a number of bytes of storage. For example, each sub-block may include 64, 128, 256 or 512 bytes of storage. In another example, each sub-block may include fewer than 64 bytes or more than 512 bytes. In some embodiments, each sub-block may correspond to a minimum write unit. In some embodiments, a subset of sub-blocks may correspond to a group of sub-blocks. For example, a first group 140-1 may include SB 1, SB 2, SB 3 and SB 4; a second group 140-2 may include SB 5, SB 6, SB 7 and SB 8; a third group 140-3 may include SB 9, SB 10, SB 11 and SB 12; and a fourth group 140-4 may include SB 13, SB 14, SB 15 and SB 16. Thus, in this example, each group may include four sub-blocks. In another example, a first subset 140-6 of sub-blocks may include groups 140-1 and 140-2 and a second subset 140-7 of sub-blocks may include groups 140-3 and 140-4. Thus, in this example, each subset may include eight sub-blocks. In another example, each group may include more than four or fewer than four sub-blocks. In another example, each subset may include more than eight or fewer than eight sub-block. The number of sub-blocks included in a group or subset is not limited to a power of two.

Memory circuitry 106 may include a count store 130 and a timestamp store 132. In some embodiments, memory circuitry 106 may include a mode indicator 129. The count store 130 is configured to store a plurality of counts C1, C2, C3, C4, ..., CK−1, CK. In an embodiment, each count may correspond to a composite state of a respective group of sub-blocks. In another embodiment, each of at least some of the counts may correspond to a composite state of a respective first group of sub-blocks and each of at least some of the counts may correspond to a compressed state of a respective second group of sub-blocks. For example, a composite count associated with a first group may correspond to a target combined count and a compressed count associated with a second group may correspond to a swap partner combined count, as described herein. For example, count C1 may be associated with the first group 140-1, count C2 may be associated with the second group 140-2, etc. In another example, count C1 may be associated with the first subset 140-6 and count C2 may be associated with the second subset 140-7, etc. Initially, the counts C1, C2, C3, C4, ..., CK−1, CK may be set to zero.

The timestamp store 132 is configured to store a plurality of timestamps TS 1, TS 2, ..., TS N. Each timestamp may be associated with a respective block. For example, TS 1 may be associated with Block 1, TS 2 may be associated with Block 2, etc. Each timestamp may correspond to a captured timer index of a most recent write to the associated block, as will be described in more detail below. Initially, the timestamps TS 1, TS 2, ..., TS N may be set to zero.

Memory controller circuitry 102 includes a timer circuitry 120, a timestamp circuitry 122, a VDM selection circuitry 124, a reduction/expansion circuitry 126 and a read/write circuitry 118. In some embodiments, memory controller circuitry 102 may further include a mode swap circuitry 128.

Timer circuitry 120 is configured to provide a periodic clock signal that has a period (i.e., timer interval), G. G may be in the range of 1 microsecond to 1 year. For example, G may be in the range of 1±0.1 second. In another example, G may be in the range of 0.1 second to 10 seconds. Each sequential timer interval may be identified by a respective timer index, e.g., 0, 1, 2, 3, ..., M−1. For example, M may be in the range of 2 to 32. In another example, M may be greater than 32. For example, for M=8, corresponding to an 8 bit timer index, the index may have a maximum value of 255 ($2^8-1$). Thus, in a sequence of timer indexes, a timer index of 255 may be followed by a timer index of 0. The timer circuitry 120 is configured to be relatively accurate but with a relatively coarse granularity. The granularity corresponds to the timer interval, G. The relatively coarse granularity is configured to reduce an amount of storage consumed by count store 130 and timestamp store 132. The granularity is related to VDM2Tmin and VDM1Tmax, as described herein.

Read/write circuitry 118 is configured to manage memory access operations (e.g., read, write and/or refresh) of memory controller circuitry 102 for memory array 104. For example, read/write circuitry 118 is configured to write data 112 received from processor circuitry 108 to memory array 104. In another example, read/write circuitry 118 is configured to read data 114 from memory array 104 and to provide the read data to processor 108. Memory controller 102 is further configured to provide an appropriate VDM, e.g., VDMx 116, where x is 1 or 2, to a selected sub-block of memory array 104 to facilitate a corresponding read operation.

A write operation may be initiated, for example, by a write request from processor circuitry 108 to write to memory array 104. Read/write circuitry 118 may be configured to identify and/or determine the block, e.g., Block 1, and a sub-block, e.g., SB 1, that is the target of the write request. Timestamp circuitry 122 is configured to capture a current timer index from timer circuitry 120 and temporarily store the captured current timer index as Index 123. Timestamp circuitry 122 may then be configured to fetch a timestamp for the block that includes the target sub-block from timestamp store 132. For example, for any of sub-blocks SB 1, SB 2, ..., SB 16 included in Block 1, TS 1 may be fetched by timestamp circuitry 122. In another example, TS 2 may be fetched by timestamp circuitry 122 for any of the sub-blocks (not shown) in Block 2.

VDM selection circuitry 124 may then be configured to fetch a composite count, e.g., C1, that represents a composite state of the target sub-block SB 1. Reduction/expansion circuitry 126 may then be configured to expand the composite count C1 into the composite state. The composite count C1 may contain a number N2 bits and the corresponding composite state may contain a number N1 trits where N2 is less than 2*N1. The composite count C1 may be expanded into the composite state using a sequence of division operations with numeral 3 as the divisor. The composite state may be determined based, at least in part, on a remainder of each division operation. For example, the first group 140-1 includes four sub-blocks (SB 1, SB 2, SB 3, SB 4) and a corresponding composite state may then include four trits. The corresponding composite count may then include 7 bits. A composite state that includes four trits corresponding to four sub-blocks may be determined with three divide by 3 operations.

As an illustrative example, if the composite count C1 is equal to 70 ($1000110_2$), the divide by three operations may be performed as follows:

70÷3=23, with remainder 1;

23÷3=7, with remainder 2; and

7÷3=2, with remainder 1.

Thus, the composite state for a composite count of 70 is $2121_3$ (base 3). It may be appreciated, that a fourth division (2 divided by 3) has been avoided by recognizing that a division result (i.e., quotient) that is less than 3 corresponds to the fourth remainder.

VDM selection circuitry 124 may then be configured to update the composite state by setting the trit corresponding to the target sub-block to zero. Continuing with the example with SB 1 as the target sub-block, the most significant trit may be set to zero. Thus, the composite state may be updated to $0xxx_3$, where each x corresponds to a trit. For the illustrative example, the updated composite state may then be $0121_3$. It may be appreciated that trit order in the composite state for the first group 140-1 may be ordered as SB 1, SB 2, SB 3, SB 4 or as SB 4, SB 3, SB 2, SB 1. In other words, the most significant trit may correspond to a first sub-block in a group and the least significant trit may correspond to a last sub-block in a group or vice versa. In the illustrative examples herein that use the first group 104-1, the composite state is ordered as the most significant trit corresponding to the state of sub-block SB1 and the least significant trit corresponding to the state of sub-block SB 4. This ordering is for ease of description and this teachings of this disclosure are not meant to be limiting in this regard.

Timestamp circuitry 122 may then be configured to determine whether the fetched timestamp, e.g., TS 1, is equal to the current timer index, Index 123.

If the timestamp TS 1 is not equal to Index 123, then reduction/expansion circuitry 126 is configured to increment any other trits in the composite state that are less than the threshold, i.e., 2. Trits that are equal to 2 may remain unchanged. For the illustrative example (composite state=$0121_3$), the trits corresponding to the respective states of SB 2 and SB 4 may be incremented and the trit corresponding to the state of SB 3 may be unchanged. As a result, an updated composite state of the illustrative example may then be $0222_3$. If the timestamp TS 1 is equal to Index 123, then the other trits in the composite state may remain unchanged (e.g., $0121_3$, in the illustrative example). In some embodiments, if the Index 123 is greater than the timestamp TS 1 by 2 or more, then the respective states of sub-blocks other than SB 1, namely SB 2, SB 3, and SB 4, may be set to 2.

Further, if the timestamp TS 1 is not equal to the current timer index, Index 123, then timestamp circuitry 122 may be configured to update the timestamp TS 1 and store Index 123 as TS 1 to timestamp store 132.

Reduction/expansion circuitry 126 is then configured to reduce the updated composite state to an updated composite count. The reduction corresponds to converting the ternary composite state to decimal and/or binary. The conversion includes multiplying each trit position by 3 raised to an appropriate power and summing the results. Thus, $0222_3 = 0*3^3 + 2*3^2 + 2*3^1 + 2*3^0 = 26 = 00110102$. Similarly, $0121_3 = 0*3^3 + 1*3^2 + 2*3^1 + 1*3^0 = 16 = 00100002$. Reduction/expansion circuitry 126 may then be configured to store the updated composite count, C1, to count store 130.

Thus, a composite state for a group (e.g., group 140-1) of sub-blocks in a block (e.g. Block 1) may be updated in response to a write to one of the sub-blocks (e.g., SB 1) included in the group 140-1.

A read operation may be initiated, for example, by a read request from processor circuitry 108 to read from memory array 104. In order to determine whether to use VDM1 or VDM2 as read reference voltage for the read operation, VDM selection circuitry 124 is configured to determine an elapsed time between a most recent write to the target sub-block and the current read operation. If the elapsed time is greater than or equal to the threshold, i.e., 2 (corresponding to an actual time of at least one clock interval, G) then VDM selection circuitry 124 is configured to select VDM2. If the elapsed time is less than 2, then VDM selection circuitry 124 is configured to select VDM1.

Read/write circuitry 118 may be configured to identify and/or determine the block, e.g., Block 1, and a sub-block, e.g., SB 1, that is the target of the read request. Timestamp circuitry 122 is configured to capture a current timer index, e.g., Index 123, from timer circuitry 120. Timestamp circuitry 122 may then be configured to fetch a timestamp for the block that includes the target sub-block, e.g., TS 1 for Block 1. VDM selection circuitry 124 may then be configured to determine whether a difference between the index and the timestamp is greater than or equal to 2, i.e., whether (Index 123)—TS1 is greater than or equal to 2. If the difference between the index and the timestamp is greater than or equal to 2, then VDM2 may be selected. Thus, if the difference between the index and the timestamp is greater than or equal to 2, then operations associated with determining a state associated with the target sub-block may be avoided.

If the difference between the index and the timestamp is less than 2, then VDM selection circuitry 124 is configured to fetch the count for the group that contains the target sub-block. For example, for a target sub-block corresponding to the first sub-block SB 1, VDM selection circuitry 124 may be configured to fetch count C1 for the first group 140-1.

In some embodiments, VDM selection circuitry 124 may be configured to determine whether a composite count corresponds to a respective state of each sub-block in the group equal to 2. For example, a four trit composite state with each state equal to 2 corresponds to a composite count of 80. Thus, in these embodiments, if the composite count is equal to 80, then VDM selection circuitry 124 may select VDM2 as the read reference voltage.

If the composite count does not correspond to all sub-blocks in the group having a corresponding state equal to 2 or in embodiments not configured to determine whether the composite count corresponds to a respective state of each sub-block in the group equal to 2, reduction/expansion circuitry 126 may be configured to expand the composite count into a corresponding composite state, as described herein. VDM selection circuitry 124 may then be configured to determine an elapsed time since a most recent write operation for the target sub-block. The elapsed time may be determined as the current timer index, e.g., Index 123, minus the timestamp for the block that includes the target sub-block plus the corresponding state of the target sub-block. For example, the elapsed time for sub-block 1 may be determined as (Index 123) minus TS 1 plus the corresponding state of SB 1. If the elapsed time is greater than or equal to 2, then VDM selection circuitry 124 is configured to select VDM2 as the read reference voltage. If the elapsed time is less than 2, then VDM selection circuitry 124 is configured to select VDM1 as the read reference voltage.

Thus, an appropriate read reference voltage may be selected based, at least in part, on the current timer, a timestamp and a target sub-block state. A granularity of the timer may be relatively coarse and a respective timestamp may be utilized for each block of memory array 104. A respective composite state for each group of sub-blocks may be stored as a corresponding composite count. A number of bits in a composite count may be less than two times a number of trits included in a composite state, as described herein.

Figure 2:
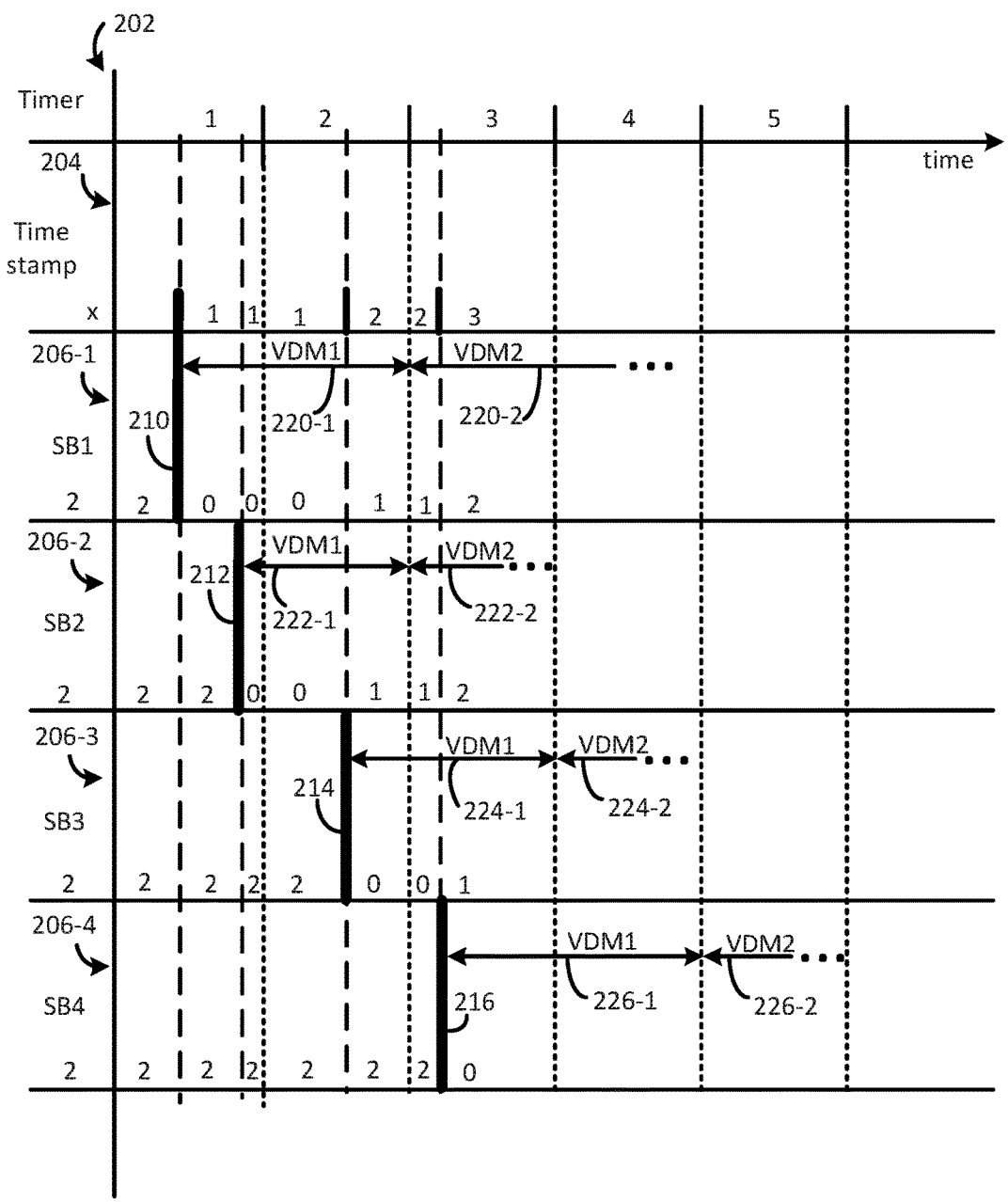
FIG. 2 is a timing diagram illustrating sub-block states for a plurality of sub-blocks for example write operations, consistent with one embodiment of the present disclosure.

FIG. 2 is a timing diagram 200 illustrating sub-block states for a plurality of sub-blocks for example write operations, consistent with one embodiment of the present disclosure. Timing diagram 200 includes a timer index 202, a timestamp 204, and individual state information 206-1, 206-2, 206-3 and 206-4 for sub-blocks SB 1, SB 2, SB 3 and SB 4, respectively. The timer index 202 includes five consecutive intervals, each of duration G, indicated by indexes 1, 2, 3, 4 and 5. In this example, initially, i.e., prior to timer interval 1, the respective individual states of each of the sub-blocks is 2.

During timer interval 1, a write 210 to SB 1 occurs. As a result, state 206-1 of SB 1 is reset to 0 from 2 and the timestamp 204 is set to 1 to correspond to the timer index at the time of the write 210. Also during timer interval 1, but at a different instant in time, a write 212 to SB 2 occurs. As a result, the state 206-2 of SB 2 is reset to 0 from 2. The timestamp 204 is unchanged (i.e., is equal to 1) since, in response to a write, the timestamp is set equal to the timer index at the time of the write.

During timer interval 2, a write 214 to SB 3 occurs. As a result, state 206-3 of SB 3 is reset to 0 from 2 and the timestamp 204 is set to 2 to correspond to the timer index at the time of the write 214. During timer interval 3, a write 216 to SB 4 occurs. As a result, state 206-4 of SB 4 is reset to 0 from 2 and the timestamp 204 is set to 3 to correspond to the timer index at the time of the write 216.

None of the individual states of SB 2, SB 3 and SB 4 change in response to write 210 because the states are equal to 2. In other words, the individual state has a maximum value of 2. Incrementing the individual state of a selected sub-block stops at 2. In this example, none of the individual states of SB 1, SB 3 and SB 4 change in response to write 212 because the timestamp 204 does not change. In other words, since the write 212 occurs in the same timer interval (i.e., index equal to 1) as the write 210, the timestamp 204 remains at 1.

At write 214, the respective individual states of both SB 1 and SB 2 increment from 0 to 1. Similarly, at write 216, the respective states of SB 1, SB 2 and SB 3 each increment. The states of SB 1 and SB 2 increment from 1 to 2 and the state of SB 3 increments from 0 to 1.

Timing diagram 200 further illustrates time intervals for each sub-block where VDM1 or VDM2 may be selected as a read reference voltage. VDM1 or VDM2 may be selected by VDM selection circuitry 124 based, at least in part, on the elapsed time. The elapsed time may be determined based, at least in part, on the current timer index, the timestamp for the block that includes the target sub-block and the individual state associated with the target sub-block, as described herein. The time intervals where VDM1 may be selected ("VDM1 time interval") correspond to an elapsed time of less than 2 (i.e., an actual time less than 2*G) and a time intervals where VDM2 may be selected ("VDM2 time interval") correspond to an elapsed time of greater than or equal to two (i.e., actual time greater than G).

For SB 1 206-1, a VDM1 time interval 220-1 begins with write 210 and ends at the start of timer interval 3. During the VDM1 time interval 220-1, the elapsed time ranges from 0 (beginning with the write 210) to 1 (beginning at the boundary between timer index 1 and timer index 2 and ending at the boundary between timer index 2 and timer index 3). The elapsed time increases to 2 when the timer index increments from 2 to 3. A VDM2 time interval 220-2 begins when the VDM1 time interval 220-1 ends, i.e., when the timer index increments from 2 to 3.

For SB 2 206-2, a VDM1 time interval 222-1 begins with write 212 and ends at the start of timer index 3. During the VDM1 time interval 222-1, the elapsed time ranges from 0 (beginning with the write 212) to 1 (beginning at the boundary between timer index 1 and timer index 2 and ending at the boundary between timer index 2 and timer index 3). A VDM2 time interval 222-2 corresponds to the VDM2 time interval 220-2.

For SB 3, a VDM1 time interval 224-1 begins with the write 214 and ends at the start of timer interval 4. The elapsed time during the VDM1 time interval 224-1 ranges from 0 (beginning with write 214) to 1 (beginning at the boundary between timer index 2 and timer index 3). A VDM2 time interval 224-2 begins when the VDM1 time interval 224-1 ends. The elapsed time for SB 3 transitions to 2 at the boundary between timer index 3 and timer index 4. In other words, when the timer index increments from 3 to 4, the current timer index (i.e., 4) minus the timestamp of last write to the block that contains SB 3 (i.e., 3)+the individual state associated with SB 3 (i.e., 1) equals the elapsed time (i.e., 2). Similarly, for SB 4, a VDM1 time interval 226-1 begins with the write 216 (elapsed time equal to 3 (timer index)−3 (timestamp)+0 (SB 4 individual state)) and ends at the start of timer interval 5. The elapsed time transitions to 2 and a VDM2 time interval 226-2 begins at the start of timer interval 5.

Thus, timing ambiguity related to write operations to a plurality of sub-blocks included in a same block when a timestamp is shared by the sub-blocks included in the block, may be accommodated. An elapsed time determined based, at least in part, on the timer index, based, at least in part, on the shared timestamp and based, at least in part, on an individual state of a target sub-block may be utilized to select an appropriate read reference voltage, VDM1 or VDM2.

Turning again to FIG. 1, in some embodiments, memory controller circuitry 102 may include mode swap circuitry 128 and memory circuitry 106 may include mode indicator 129. In these embodiments, individual states may be full or condensed, combined states may be composite or compressed and combined counts may be composite or compressed. A compressed count represents a compressed state. A respective bit in a compressed count may further represent each sub-block state, as described herein.

The mode swap circuitry 128 is configured to manage swapping a first composite state with a second compressed state. A plurality of sub-blocks associated with the first composite state may be included in or may correspond to a first group or a first subset. A plurality of sub-blocks associated with the second compressed state may be included in or may correspond to a second group or a second subset. The second group is different from the first group and the second subset is different from the first subset.

In an embodiment, one group may correspond to a first composite state and a plurality of groups may correspond to respective compressed states. In these embodiments, a number J total groups may then include one group with a corresponding composite state and J−1 groups with respective compressed states. In another embodiment, one group may correspond to a first composite state and one group may correspond to a second compressed state.

The mode indicator 129 is configured to indicate whether an individual state of a sub-block is full or compressed and/or whether a respective state of each group is composite or the compressed. For example, the mode indicator 129 may include a plurality of bits with each bit representing a respective state of a corresponding group.

For example, the first composite state may be associated with the first group 104-1 and the second compressed state may be associated with the second group 104-2. In another example, the first composite state may be associated with the first subset 104-6 and the second compressed state may be associated with the second subset 104-7. In another example, the first group 104-1 may correspond to the composite state and groups 104-2, 104-3, 104-4 may each correspond to respective compressed states.

As used herein, swapping corresponds to converting a first composite state associated with a first group to a first compressed state and/or converting a second compressed state associated with a second group to a second composite state. For the first group, a full state representation may be converted to a condensed state representation and, for the second group, a condensed state representation may be converted to a full state representation for each individual state included in a corresponding group. A compressed count occupies less storage than a composite count for a same number of sub-blocks. Swapping is configured to facilitate condensing three full states (individual states) into two condensed states (individual states) while ensuring that an elapsed time determined based, at least in part, on a condensed state, is accurate.

In operation, the swapping may be triggered by a write operation when a corresponding timestamp is not equal to the current timer index. In other words, a write operation that occurs during a timer interval with a corresponding index different from a stored timestamp may trigger swapping operations and a write operation that occurs during a timer interval with a corresponding index that is the same as a stored timestamp may not trigger swapping operations.

Mode swap circuitry 128 is configured to identify a first composite count and a second compressed count. For example, mode swap circuitry 128 may be configured to identify the first composite count and the second compressed count based, at least in part, on the mode indicator 129. If the corresponding combined counts associated with groups of sub-block states include one composite state and a plurality of compressed states, then mode swap circuitry 128 may be configured to sequentially select each compressed count in response to a sequence of write operations. Mode swap circuitry 128 may be configured to select the composite count based, at least in part, on the mode indicator 129.

The VDM selection circuitry 124 is configured to fetch the identified counts. For example, VDM selection circuitry 124 may be configured to fetch the first composite count, e.g., C1, and the second compressed count, e.g., C2. For example, the first composite count C1 may correspond to the first group 140-1 and the second compressed count C2 may correspond to the second group 140-2. Both groups 140-1, 140-2 are included in Block 1 and, thus, share timestamp TS 1.

Reduction/expansion circuitry 126 may then be configured to expand the first composite count to a corresponding first composite state, as described herein. Mode swap circuitry 128 and/or reduction/expansion circuitry 126 may be configured to convert the second compressed count to a second composite state. VDM selection circuitry 124 may then be configured to set a selected trit in the first composite state or the second composite state to 0. The selected trit corresponds to the written to sub-block, e.g., SB 1, included in the first group 140-1, or, e.g., SB 6 included in the second group 140-2. The VDM selection circuitry 124 may then be configured to update any trits (except the trit corresponding to SBy) that are less than 2. For example, each trit may be incremented by 1. Thus, the first composite state and/or the second composite state may be updated.

In some embodiments, if a difference between the timer index ("index") and the timestamp for the block, e.g., TS 1, is greater than or equal to 2, then VDM selection circuitry 124 is configured to set all of the trits, except the trit corresponding to sub-block SBy to 2. In other words, the elapsed time is greater than or equal to 2.

Reduction/expansion circuitry 126 is configured to reduce the second composite state to a second composite count. Mode swap circuitry 128 may then be configured to convert the first composite state to a first compressed state (first compressed count). The second composite state and/or first composite state may have been updated. The second composite count and first compressed count may then be stored to count store 130.

Converting from the composite state to the compressed state includes converting each individual full state trit to a corresponding individual condensed state bit. Converting from the compressed state to the composite state includes converting each individual condensed state bit to a corresponding individual full state trit. The number of trits in the composite state may be the same as the number of bits in the compressed state and may correspond to group (or subset) size, as described herein. Table 1 illustrates converting from the full state to the condensed state. Table 2 illustrates converting from the condensed state to the full state.

TABLE 1

| Full state | Condensed state |
|---|---|
| 0 | 0 |
| 1 | 0 |
| 2 | 1 |

TABLE 2

| Condensed state | Full state |
|---|---|
| 0 | 0 |
| 1 | 2 |

The composite state may include a plurality of trits with each trit corresponding to a full individual state and the compressed state may include a plurality of bits with each bit corresponding to a condensed individual state, as described herein. Referring now to Table 1, full individual states 0 and 1 may be converted to the individual condensed state 0. An individual full state value of 2 may be converted to the condensed state value 1. Thus, a compressed state bit equal to 1, representing an individual condensed state, may be interpreted as the full state value 2.

Referring now to Table 2, converting from the compressed state (condensed individual states) to the composite state (full individual states) converts from two condensed individual states to two full individual states. In other words, a condensed state of value 0 converts to a full state of value 0 and a condensed state of value 1 converts to a full state of value 2. Swapping between the composite state and compressed state is configured to effectively provide an intermediate state between the condensed individual state value of 0 and the condensed individual state value of 1.

VDM selection circuitry 124 may then be configured to store the updated first compressed count and updated second composite count to count store 130, e.g., to count C1 and count C2 for groups 104-1 and 104-2, respectively. Upon a next write operation to a sub-block included in block Block 1, the composite count, e.g., C2 may be swapped with an other compressed count, as described herein.

For example, a compressed state bit of value 0 prior to the first write operation may be converted to a composite state trit and then incremented to composite state trit value of 1. At the next write operation, the composite state trit with value 1 may be incremented then converted to a compressed state bit of value 1. Thus, the swapping facilitates incrementing a compressed state bit to ensure that a compressed state bit of value 1 corresponds to an elapsed time of 2 and a corresponding actual time of at least one timer interval, G.

In the embodiments that include mode swap circuitry 128, the particular elapsed time determination operations that may be performed in response to a read request depend on whether the state of the target sub-block is represented by a bit (i.e., individual condensed state) or a trit (i.e., individual full state). For example, whether the state of the target sub-block is included in a compressed count or a composite count may be determined by a mode bit.

For example, the first subset 140-6 of sub-blocks may correspond to a composite state, i.e., may include a respective individual full state for each sub-block included in the subset and the second subset 140-7 of sub-blocks may correspond to a compressed state, i.e., may include a respective condensed state for each sub-block included in the subset. In another example, second subset 140-7 of sub-blocks may correspond to the composite state and the first subset 140-6 of sub-blocks may correspond to the compressed state. The foregoing two examples illustrate two possible configurations of composite states and compressed states for the first subset 140-6 and the second subset 140-7. The mode bit is configured to indicate which of the two configurations is in effect for a subset, group and/or sub-block. The mode bit may be used to determine whether a state of a particular sub-block is associated with an individual full state or an individual condensed state.

In some embodiments, to further reduce storage requirements in count store 130, for J sub-blocks, one group of sub-blocks may have an associated composite state and each group of J−1 groups of sub-blocks may have an associated respective compressed state. The mode value may then include $\log_2 J$ bits, configured to indicate J different configurations of composite state and compressed state allocation between the different groups in the block. Then, whenever the timestamp is different from the timer index during a write operation, a new mode may be selected. Each group and (corresponding sub-blocks) may then have a chance to have a full state every J writes, in which the timestamp is different from the timer index. In these embodiments, the granularity, G, may be greater than VDM2Tmin and (J+1)*G may be less than VDM1Tmax.

If the target sub-block state is represented by a trit, then read operations may proceed as described herein for a composite count. If the target sub-block state is represented by a bit, then VDM selection circuitry 124 may be configured to fetch the compressed count and to determine whether the corresponding compressed bit is a zero or a one. If the bit is a one (corresponding to a trit equal to 2), then selection circuitry 124 may select VDM2. If the bit is a zero, then selection circuitry 124 may select VDM1. It may be appreciated that the compressed count may not be evaluated if a difference between the current timer index and the stored timestamp for the block that includes the target sub-block is greater than or equal to 2.

Thus, an amount of count storage occupied by counts representing sub-block states may be further reduced by using both composite counts and compressed counts. The swapping is configured to facilitate condensing ternary states 0 and 1 into binary state 0 while ensuring that VDM2 is selected when appropriate.

FIG. 3 is a flowchart 300 of time tracking write operations according to various embodiments of the present disclosure. In particular, the flowchart 300 illustrates updating composite counts in response to a write to a sub-block, SBy, y=1, 2, . . . , or Y, Y=number of sub-blocks in a block. The operations may be performed, for example, by elements of memory controller circuitry 102, e.g., read/write circuitry 118, timer circuitry 120, timestamp circuitry 122, VDM selection circuitry 124 and reduction/expansion circuitry 126, of FIG. 1.

Operations of this embodiment may begin with capturing a timer index ("index") at operation 302. Operation 304 may include fetching a timestamp for a block, e.g., Block X, that includes sub-block SBy. A composite count for the group that contains SBy may be fetched at operation 306. The composite count may be expanded to a composite state at operation 308. A trit corresponding to SBy may be set to zero at operation 310.

Whether the timestamp is equal to the index may be determined at operation 312. If the timestamp is not equal to the index, any other trits in the composite state that are less than 2 may be incremented in operation 314. The timestamp may be updated at operation 316. For example, the captured index may be stored to the timestamp store. Program flow may then proceed to operation 318. If the timestamp is equal to the index, program flow may proceed to operation 318. The updated composite state may be reduced to an updated composite count at operation 318. The updated composite count may be stored to the count store at operation 320. Program flow may then continue at operation 322.

Thus, a composite count may be updated in response to a write operation.

Figure 4:
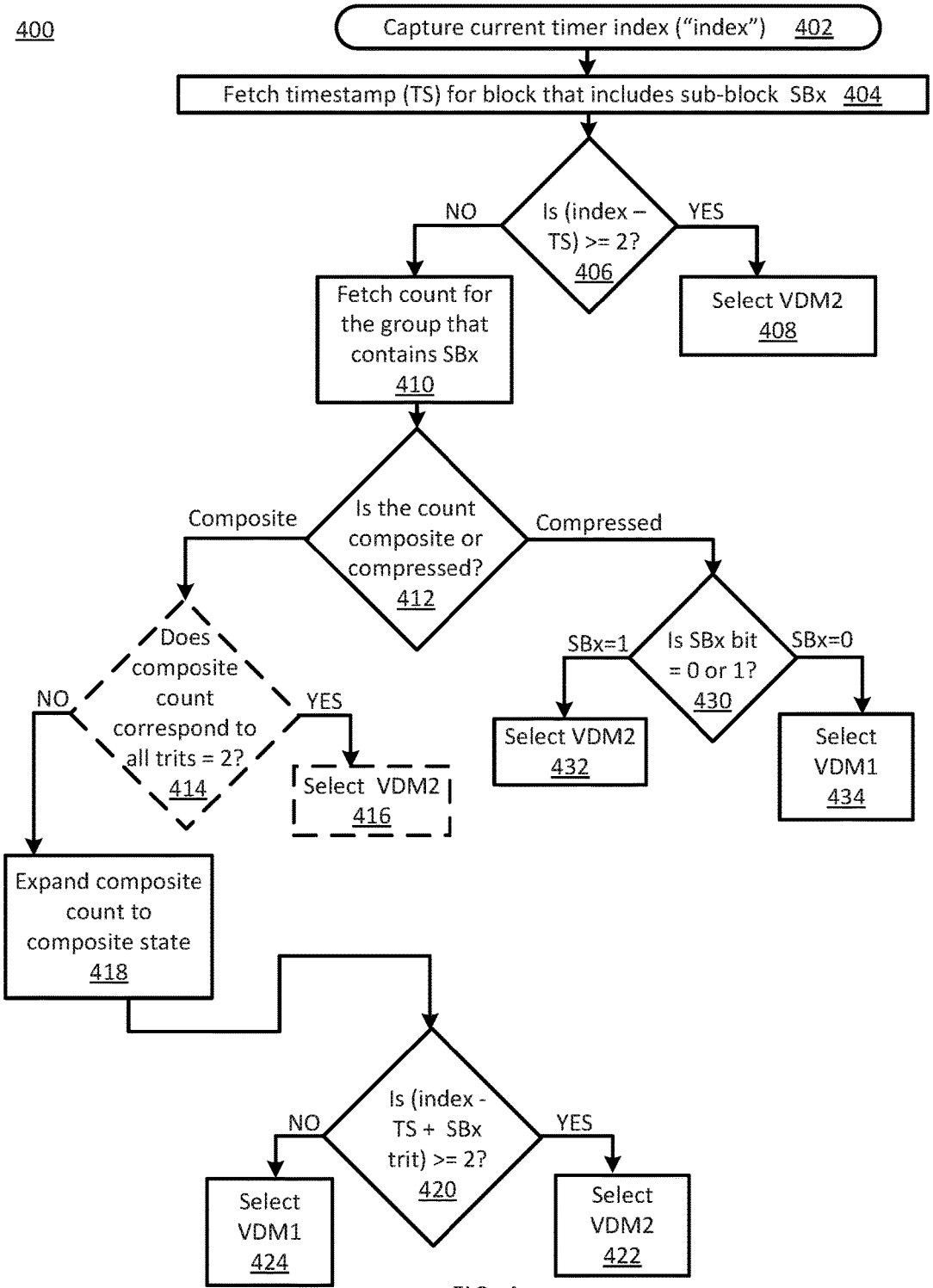
FIG. 4 is a flowchart of time tracking read operations according to various embodiments of the present disclosure.

FIG. 4 is a flowchart 400 of time tracking read operations according to various embodiments of the present disclosure. In particular, the flowchart 400 illustrates selecting a read reference voltage based, at least in part, on an elapsed time between a most recent write to a target sub-block (SBx). The flowchart 400 includes read operations for composite and/or compressed counts. The operations may be performed, for example, by elements of memory controller circuitry 102 (e.g., timer circuitry 120, timestamp circuitry 122, VDM selection circuitry 124, reduction/expansion circuitry 126, mode swap circuitry 128 and/or read/write circuitry 118) of FIG. 1.

Operations of this embodiment may begin with capturing a current timer index ("index") at operation 402. Operation 404 may include fetching a timestamp (TS) for the block that includes sub-block SBx. Whether a difference between the index and the timestamp is greater than or equal to 2 may be determined in operation 406. If the index minus the timestamp is greater than or equal to 2, then VDM2 may be selected as read reference voltage at operation 408. If the index minus the timestamp is less than 2, then a count for the group that contains the sub-block SBx may be fetched at operation 410.

Whether the count is a composite count or a compressed count may be determined at operation 412. If the count is a composite count, then, in some embodiments, whether the composite count corresponds to a composite state with all trits equal to 2 (i.e., composite count equal to 80) may be determined at operation 414. If all of the trits are equal to two, then VDM2 may be selected as the read reference voltage at operation 416. If the composite count does not correspond to all trits in the composite state equal to 2, the composite count may be expanded into a corresponding composite state at operation 418. Whether the elapsed time (index−timestamp+sub-block SBx individual state) is greater than or equal to 2 may be determined at operation 420. If the elapsed time is greater than or equal to 2, then VDM2 may be selected at operation 422. In other words, the read reference voltage may be set to VDM2. If the elapsed time is less than 2, then VDM1 may be selected at operation 424. In other words, the read reference voltage may be set to VDM1.

If the count is a compressed count, whether the bit corresponding to sub-block SBx is equal to a zero or a one may be determined at operation 430. If the SBx bit is equal to one, then VDM2 may be selected (i.e., the read reference voltage may be set to VDM2) at operation 432. If the SBx bit is equal to zero, then VDM1 may be selected (i.e., the read reference voltage may be set to VDM1) at operation 434.

Thus, an appropriate read reference voltage may be selected based, at least in part, on an elapsed time.

Figure 5:
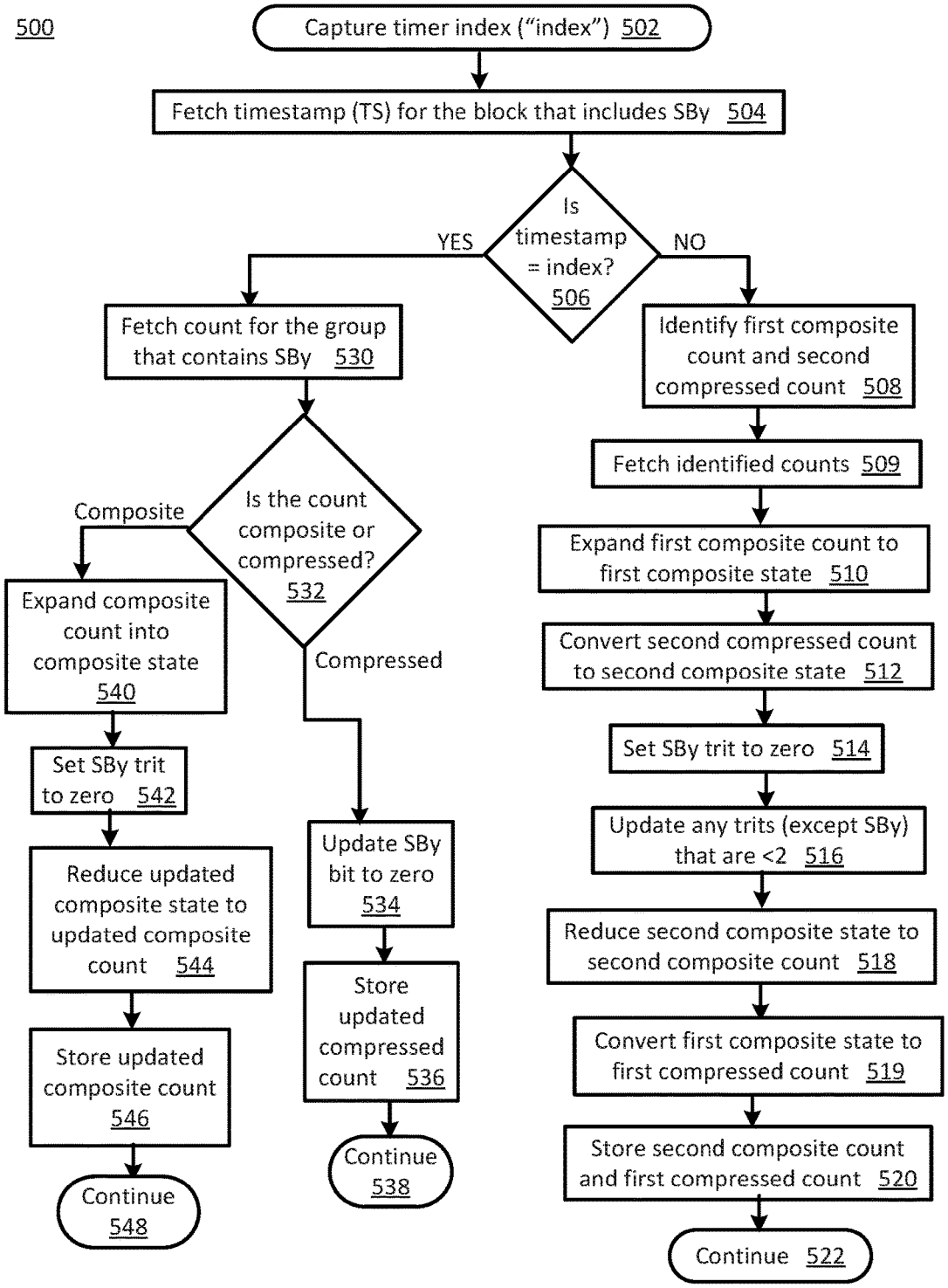
FIG. 5 is flowchart of time tracking write operations with swap according to various embodiments of the present disclosure.

FIG. 5 is flowchart 500 of time tracking write operations with swap according to various embodiments of the present disclosure. In particular, the flowchart 500 illustrates updating a composite and/or a compressed count in response to a write to sub-block SBy. The operations may be performed, for example, by elements of memory controller circuitry 102 (e.g., timer circuitry 120, timestamp circuitry 122, VDM selection circuitry 124, reduction/expansion circuitry 126, mode swap circuitry 128 and/or read/write circuitry 118) of FIG. 1.

Operations of this embodiment may begin with capturing a timer index ("index") at operation 502. A timestamp (TS) for the block that includes the target sub-block SBy may be fetched at operation 504. Whether the timestamp is equal to the index may be determined at operation 506.

If the timestamp is not equal to the index, a first composite count and a second compressed count may be identified at operation 508. The identified counts may be fetched at operation 509. The first composite count may be expanded to a first composite state, as described herein, at operation 510. The second compressed count may be converted to a second composite state at operation 512. The trit associated with SBy may be set to zero at operation 514. The trit associated with SBy may be included in the first composite state or the second composite state.

Operation 516 includes updating any trits (except SBy) that are less than 2. In some embodiments, operation 516 may include setting any trits except SBy to 2, if the difference between the timestamp and the index is greater than or equal to 2. The second composite state may be reduced to a second composite count at operation 518. The first composite state may be converted to a first compressed count at operation 519. The second composite count and the first compressed count may be stored to a count store in operation 520. Program flow may then continue in operation 522.

If the timestamp is equal to the index, a count for the group that contains SBy may be fetched at operation 530. Whether the count is composite or compressed may be determined at operation 532. If the count is compressed, the bit corresponding to sub-block SBy may be set to zero at operation 534. The updated compressed count may then be stored to count store at operation 536. Program flow may then continue at operation 538. If the count is composite than the composite count may be expanded into a composite state at operation 540. The trit corresponding to SBy may be set to zero at operation 542. The updated composite state may be reduced to an updated composite count at operation 544. The updated composite count may be stored to a count store at operation 546. Program flow may then continue in operation 548.

Thus, a composite count and/or a compressed count may be updated in response to a write operation.

While the flowcharts of FIGS. 3, 4 and 5 illustrate operations according various embodiments, it is to be understood that not all of the operations depicted in FIGS. 3, 4 and 5 are necessary for other embodiments. In addition, it is fully contemplated herein that in other embodiments of the present disclosure, the operations depicted in FIGS. 3, 4 and/or 5 and/or other operations described herein may be combined in a manner not specifically shown in any of the drawings, and such embodiments may include less or more operations than are illustrated in FIGS. 3, 4 and 5. Thus, claims directed to features and/or operations that are not exactly shown in one drawing are deemed within the scope and content of the present disclosure.

As used in any embodiment herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry," as used in any embodiment herein, may comprise, for example, singly or in any combination, hard-wired circuitry, programmable circuitry, state machine circuitry, logic and/or firmware that stores instructions executed by programmable circuitry. The circuitry may be embodied as an integrated circuit, such as an integrated circuit chip. In some embodiments, the circuitry may be formed, at least in part, by the processors 108 executing code and/or instructions sets (e.g., software, firmware, etc.) corresponding to the functionality described herein, thus transforming a general-purpose processor into a specific-purpose processing environment to perform one or more of the operations described herein. In some embodiments, the various components and circuitry of the memory controller circuitry or other systems may be combined in a system-on-a-chip (SoC) architecture.

The foregoing provides example system architectures and methodologies, however, modifications to the present disclosure are possible. The processor may include one or more processor cores and may be configured to execute system software. System software may include, for example, an operating system. Device memory may include I/O memory buffers configured to store one or more data packets that are to be transmitted by, or received by, a network interface.

The operating system (OS) may be configured to manage system resources and control tasks that are run on, e.g., system 100. For example, the OS may be implemented using Microsoft® Windows®, HP-UX®, Linux®, or UNIX®, although other operating systems may be used. In another example, the OS may be implemented using Android™, iOS, Windows Phone® or BlackBerry®. In some embodiments, the OS may be replaced by a virtual machine monitor (or hypervisor) which may provide a layer of abstraction for underlying hardware to various operating systems (virtual machines) running on one or more processing units. The operating system and/or virtual machine may implement a protocol stack. A protocol stack may execute one or more programs to process packets. An example of a protocol stack is a TCP/IP (Transport Control Protocol/Internet Protocol) protocol stack comprising one or more programs for handling (e.g., processing or generating) packets to transmit and/or receive over a network.

Memory 106, 104 may each include one or more of the following types of memory: semiconductor firmware memory, programmable memory, non-volatile memory, read only memory, electrically programmable memory, random access memory, flash memory, magnetic disk memory, and/or optical disk memory. Either additionally or alternatively system memory may include other and/or later-developed types of computer-readable memory.

Embodiments of the operations described herein may be implemented in a computer-readable storage device having stored thereon instructions that when executed by one or more processors perform the methods. The processor may include, for example, a processing unit and/or programmable circuitry. The storage device may include a machine readable storage device including any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of storage devices suitable for storing electronic instructions.

In some embodiments, a hardware description language (HDL) may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

In some embodiments, a Verilog hardware description language (HDL) may be used to specify circuit and/or logic implementation(s) for the various logic and/or circuitry described herein. For example, in one embodiment, the HDL may comply or be compatible with IEEE standard 62530-2011: SystemVerilog—Unified Hardware Design, Specification, and Verification Language, dated Jul. 7, 2011; IEEE Std 1800™-2012: IEEE Standard for SystemVerilog-Unified Hardware Design, Specification, and Verification Language, released Feb. 21, 2013; IEEE standard 1364-2005: IEEE Standard for Verilog Hardware Description Language, dated Apr. 18, 2006 and/or other versions of Verilog HDL and/or SystemVerilog standards.

EXAMPLES

Examples of the present disclosure include subject material such as a method, means for performing acts of the method, a device, or of an apparatus or system related to time tracking with trits, as discussed below.

Example 1

According to this example, there is provided a memory controller circuitry. The memory controller includes a timestamp circuitry and a demarcation voltage (VDM) selection circuitry. The timestamp circuitry is to capture a timer index from a timer having a granularity. The timestamp circuitry is further to fetch a timestamp for a memory block that includes a group of sub-blocks that includes a target sub-block. The demarcation voltage (VDM) selection circuitry is to fetch a combined count from a count store. The combined count represents a combined state. The combined state includes a target individual state of the target sub-block and a respective individual state of each of at least one other sub-block of the group of sub-blocks included in the memory block.

Example 2

This example includes the elements of example 1, wherein the VDM selection circuitry is to determine an elapsed time based, at least in part, on the timer index, the timestamp and the target individual state.

Example 3

This example includes the elements of example 1, further including a reduction/expansion circuitry to expand a composite count into a composite state, the composite count including a number N2 bits, the composite state including a number N1 trits, the target individual state corresponding to one trit of the N1 trits, N2 less than 2*N1.

Example 4

This example includes the elements of example 2, wherein the VDM selection circuitry is to determine the elapsed time in response to a read request for the target sub-block and to select a first demarcation voltage (VDM1) if the elapsed time is less than two or a second demarcation voltage (VDM2) if the elapsed time is greater than or equal to two.

Example 5

This example includes the elements according to any one of examples 1 to 3, wherein the VDM selection circuitry is to set the target individual state of the target sub-block to zero in response to a write to the target sub-block.

Example 6

This example includes the elements of example 5, wherein, if the timer index is not equal to the timestamp, the VDM selection circuitry is to increment an other trit in the composite state in response to the write to the target sub-block if the other trit is less than two and the timestamp circuitry is to associate the captured timer index with the memory block and store the captured timer index to a timestamp store.

Example 7

This example includes the elements according to any one of examples 1 to 3, further including a mode swap circuitry and a reduction/expansion circuitry, the mode swap circuitry to identify a first composite count and a second compressed count, the VDM selection circuitry to fetch the first composite count and the second compressed count, the reduction/expansion circuitry to expand the first composite count to a corresponding first composite state, and the mode swap circuitry to convert the second compressed count to a second composite state and to set the target individual state of the target sub-block to zero in response to a write request to the target sub-block, if the timestamp is not equal to the timer index.

Example 8

This example includes the elements of example 7, wherein the VDM selection circuitry is to update a trit if the trit is less than two.

Example 9

This example includes the elements of example 7, wherein the reduction/expansion circuitry is to reduce the second composite state to a second composite count and the mode swap circuitry is to convert the first composite state to a first compressed count.

Example 10

This example includes the elements according to any one of examples 1 to 3, wherein the timer granularity is in the range of 0.1 second to 100 seconds.

Example 11

This example includes the elements according to any one of examples 1 to 3, wherein two times the timer granularity is less than a maximum actual time (VDM1Tmax) associated with a first demarcation voltage (VDM1).

Example 12

This example includes the elements according to any one of examples 1 to 3, wherein the timer granularity is greater than a maximum actual time (VDM2Tmin) associated with a second demarcation voltage (VDM2).

Example 13

This example includes the elements of example 3, wherein N1 is equal to eight and N2 is equal to thirteen.

Example 14

According to this example, there is provided a method. The method includes capturing, by a timestamp circuitry, a timer index from a timer having a granularity; fetching, by the timestamp circuitry, a timestamp for a memory block that includes a group of sub-blocks that includes a target sub-block; and fetching, by a demarcation voltage (VDM) selection circuitry, a combined count from a count store. The combined count represents a combined state. The combined state includes a target individual state of the target sub-block and a respective individual state of each of at least one other sub-block of the group of sub-blocks included in the memory block.

Example 15

This example includes the elements of example 14, further including determining, by the VDM selection circuitry, an elapsed time based, at least in part, on the timer index, the timestamp and the target individual state.

Example 16

This example includes the elements of example 14, further including expanding, by a reduction/expansion circuitry, a composite count into a composite state, the composite count including a number N2 bits, the composite state including a number N1 trits, the target individual state corresponding to one trit of the N1 trits, N2 less than 2*N1.

Example 17

This example includes the elements of example 15, further including determining, by the VDM selection circuitry, the elapsed time in response to a read request for the target sub-block and selecting, by the VDM selection circuitry, a first demarcation voltage (VDM1) if the elapsed time is less than two or a second demarcation voltage (VDM2) if the elapsed time is greater than or equal to two.

Example 18

This example includes the elements of example 14, further including setting, by the VDM selection circuitry, the target individual state of the target sub-block to zero in response to a write to the target sub-block.

Example 19

This example includes the elements of example 18, further including, if the timer index is not equal to the timestamp, incrementing, by the VDM selection circuitry, an other trit in the composite state in response to the write to the target sub-block if the other trit is less than two; associating, by the timestamp circuitry, the captured timer index with the memory block; and storing, by the timestamp circuitry, the captured timer index to a timestamp store.

Example 20

This example includes the elements of example 14, further including identifying, by the mode swap circuitry, a first composite count and a second compressed count; fetching, by the VDM selection circuitry, the first composite count and the second compressed count; expanding, by the reduction/expansion circuitry, the first composite count to a corresponding first composite state; converting, by the mode swap circuitry, the second compressed count to a second composite state; and setting, by the mode swap circuitry, the target individual state of the target sub-block to zero in response to a write request to the target sub-block, if the timestamp is not equal to the timer index.

Example 21

This example includes the elements of example 20, further including updating, by the VDM selection circuitry, a trit if the trit is less than two.

Example 22

This example includes the elements of example 20, further including reducing, by the reduction/expansion circuitry, the second composite state to a second composite count; and converting, by the mode swap circuitry, the first composite state to a first compressed count.

Example 23

This example includes the elements of example 14, wherein the timer granularity is in the range of 0.1 second to 100 seconds.

Example 24

This example includes the elements of example 14, wherein two times the timer granularity is less than a maximum actual time (VDM1Tmax) associated with a first demarcation voltage (VDM1).

Example 25

This example includes the elements of example 14, wherein the timer granularity is greater than a maximum actual time (VDM2Tmin) associated with a second demarcation voltage (VDM2).

Example 26

This example includes the elements of example 16, wherein N1 is equal to eight and N2 is equal to thirteen.

Example 27

According to this example, there is provided a time tracking system. The time tracking system includes a processor circuitry; a memory array; a memory circuitry; and a memory controller. The memory array includes a plurality of memory blocks. The memory circuitry includes a count store and a timestamp store. The memory controller includes a timestamp circuitry and a demarcation voltage (VDM) selection circuitry. The timestamp circuitry is to capture a timer index from a timer having a granularity. The timestamp circuitry is further to fetch a timestamp for a memory block that includes a group of sub-blocks that includes a target sub-block. The demarcation voltage (VDM) selection circuitry is to fetch a combined count from a count store. The combined count represents a combined state. The combined state includes a target individual state of the target sub-block and a respective individual state of each of at least one other sub-block of the group of sub-blocks included in the memory block.

Example 28

This example includes the elements of example 27, wherein the VDM selection circuitry is to determine an elapsed time based, at least in part, on the timer index, the timestamp and the target individual state.

Example 29

This example includes the elements of example 27, further including a reduction/expansion circuitry to expand a composite count into a composite state, the composite count including a number N2 bits, the composite state including a number N1 trits, the target individual state corresponding to one trit of the N1 trits, N2 less than 2*N1.

Example 30

This example includes the elements of example 28, wherein the VDM selection circuitry is to determine the elapsed time in response to a read request for the target sub-block and to select a first demarcation voltage (VDM1) if the elapsed time is less than two or a second demarcation voltage (VDM2) if the elapsed time is greater than or equal to two.

Example 31

This example includes the elements according to any one of examples 27 to 29, wherein the VDM selection circuitry is to set the target individual state of the target sub-block to zero in response to a write to the target sub-block.

Example 32

This example includes the elements of example 31, wherein, if the timer index is not equal to the timestamp, the VDM selection circuitry is to increment an other trit in the composite state in response to the write to the target sub-block if the other trit is less than two and the timestamp circuitry is to associate the captured timer index with the memory block and store the captured timer index to a timestamp store.

Example 33

This example includes the elements according to any one of examples 27 to 29, further including a mode swap circuitry and a reduction/expansion circuitry, the mode swap circuitry to identify a first composite count and a second compressed count, the VDM selection circuitry to fetch the first composite count and the second compressed count, the reduction/expansion circuitry to expand the first composite count to a corresponding first composite state, and the mode swap circuitry to convert the second compressed count to a second composite state and to set the target individual state of the target sub-block to zero in response to a write request to the target sub-block, if the timestamp is not equal to the timer index.

Example 34

This example includes the elements of example 33, wherein the VDM selection circuitry is to update a trit if the trit is less than two.

Example 35

This example includes the elements of example 33, wherein the reduction/expansion circuitry is to reduce the second composite state to a second composite count and the mode swap circuitry is to convert the first composite state to a first compressed count.

Example 36

This example includes the elements according to any one of examples 27 to 29, wherein the timer granularity is in the range of 0.1 second to 100 seconds.

Example 37

This example includes the elements according to any one of examples 27 to 29, wherein two times the timer granularity is less than a maximum actual time (VDM1Tmax) associated with a first demarcation voltage (VDM1).

Example 38

This example includes the elements according to any one of examples 27 to 29, wherein the timer granularity is greater than a maximum actual time (VDM2Tmin) associated with a second demarcation voltage (VDM2).

Example 39

This example includes the elements of example 29, wherein N1 is equal to eight and N2 is equal to thirteen.

Example 40

According to this example, there is provided a computer readable storage device. The device has stored thereon instructions that when executed by one or more processors result in the following operations including capturing a timer index from a timer having a granularity; fetching a timestamp for a memory block that includes a group of sub-blocks that includes a target sub-block; and fetching a combined count from a count store. The combined count represents a combined state. The combined state includes a target individual state of the target sub-block and a respective individual state of each of at least one other sub-block of the group of sub-blocks included in the memory block.

Example 41

This example includes the elements of example 40, wherein the instructions that when executed by one or more processors results in the following additional operations including determining an elapsed time based, at least in part, on the timer index, the timestamp and the target individual state.

Example 42

This example includes the elements of example 40, wherein the instructions that when executed by one or more processors results in the following additional operations including expanding a composite count into a composite state, the composite count including a number N2 bits, the composite state including a number N1 trits, the target individual state corresponding to one trit of the N1 trits, N2 less than 2*N1.

Example 43

This example includes the elements of example 41, wherein the instructions that when executed by one or more processors results in the following additional operations including determining the elapsed time in response to a read request for the target sub-block and selecting a first demarcation voltage (VDM1) if the elapsed time is less than two or a second demarcation voltage (VDM2) if the elapsed time is greater than or equal to two.

Example 44

This example includes the elements according to any one of examples 40 to 42, wherein the instructions that when executed by one or more processors results in the following additional operations including setting the target individual state of the target sub-block to zero in response to a write to the target sub-block.

Example 45

This example includes the elements of example 44, wherein the instructions that when executed by one or more processors results in the following additional operations including, if the timer index is not equal to the timestamp, incrementing an other trit in the composite state in response to the write to the target sub-block if the other trit is less than two; associating the captured timer index with the memory block; and storing the captured timer index to a timestamp store.

Example 46

This example includes the elements according to any one of examples 40 to 42, wherein the instructions that when executed by one or more processors results in the following additional operations including identifying a first composite count and a second compressed count; fetching the first composite count and the second compressed count; expanding the first composite count to a corresponding first composite state; converting the second compressed count to a second composite state; and setting the target individual state of the target sub-block to zero in response to a write request to the target sub-block, if the timestamp is not equal to the timer index.

Example 47

This example includes the elements of example 46, wherein the instructions that when executed by one or more processors results in the following additional operations including updating a trit if the trit is less than two.

Example 48

This example includes the elements of example 46, wherein the instructions that when executed by one or more processors results in the following additional operations including reducing the second composite state to a second composite count; and converting the first composite state to a first compressed count.

Example 49

This example includes the elements according to any one of examples 40 to 42, wherein the timer granularity is in the range of 0.1 second to 100 seconds.

Example 50

This example includes the elements according to any one of examples 40 to 42, wherein two times the timer granularity is less than a maximum actual time (VDM1Tmax) associated with a first demarcation voltage (VDM1).

Example 51

This example includes the elements according to any one of examples 40 to 42, wherein the timer granularity is greater than a maximum actual time (VDM2Tmin) associated with a second demarcation voltage (VDM2).

Example 52

This example includes the elements of example 42, wherein N1 is equal to eight and N2 is equal to thirteen.

Example 53

According to this example, there is provided a time tracking device. The time tracking device includes means for capturing, by a timestamp circuitry, a timer index from a timer having a granularity; means for fetching, by the timestamp circuitry, a timestamp for a memory block that includes a group of sub-blocks that includes a target sub-block; and means for fetching, by a demarcation voltage (VDM) selection circuitry, a combined count from a count store. The combined count represents a combined state. The combined state includes a target individual state of the target sub-block and a respective individual state of each of at least one other sub-block of the group of sub-blocks included in the memory block.

Example 54

This example includes the elements of example 53, further including means for determining, by the VDM selection circuitry, an elapsed time based, at least in part, on the timer index, the timestamp and the target individual state.

Example 55

This example includes the elements of example 53, further including means for expanding, by a reduction/expansion circuitry, a composite count into a composite state, the composite count including a number N2 bits, the composite state including a number N1 trits, the target individual state corresponding to one trit of the N1 trits, N2 less than 2*N1.

Example 56

This example includes the elements of example 54, further including means for determining, by the VDM selection circuitry, the elapsed time in response to a read request for the target sub-block and means for selecting, by the VDM selection circuitry, a first demarcation voltage (VDM1) if the elapsed time is less than two or a second demarcation voltage (VDM2) if the elapsed time is greater than or equal to two.

Example 57

This example includes the elements according to any one of examples 53 to 55, further including means for setting, by the VDM selection circuitry, the target individual state of the target sub-block to zero in response to a write to the target sub-block.

Example 58

This example includes the elements of example 57, further including, if the timer index is not equal to the timestamp, means for incrementing, by the VDM selection circuitry, an other trit in the composite state in response to the write to the target sub-block if the other trit is less than two; means for associating, by the timestamp circuitry, the captured timer index with the memory block; and means for storing, by the timestamp circuitry, the captured timer index to a timestamp store.

Example 59

This example includes the elements according to any one of examples 53 to 55, further including means for identifying, by the mode swap circuitry, a first composite count and a second compressed count; means for fetching, by the VDM selection circuitry, the first composite count and the second compressed count; means for expanding, by the reduction/expansion circuitry, the first composite count to a corresponding first composite state; means for converting, by the mode swap circuitry, the second compressed count to a second composite state; and means for setting, by the mode swap circuitry, the target individual state of the target sub-block to zero in response to a write request to the target sub-block, if the timestamp is not equal to the timer index.

Example 60

This example includes the elements of example 59, further including means for updating, by the VDM selection circuitry, a trit if the trit is less than two.

Example 61

This example includes the elements of example 59, further including means for reducing, by the reduction/expansion circuitry, the second composite state to a second composite count; and means for converting, by the mode swap circuitry, the first composite state to a first compressed count.

Example 62

This example includes the elements according to any one of examples 53 to 55, wherein the timer granularity is in the range of 0.1 second to 100 seconds.

Example 63

This example includes the elements according to any one of examples 53 to 55, wherein two times the timer granularity is less than a maximum actual time (VDM1Tmax) associated with a first demarcation voltage (VDM1).

Example 64

This example includes the elements according to any one of examples 53 to 55, wherein the timer granularity is greater than a maximum actual time (VDM2Tmin) associated with a second demarcation voltage (VDM2).

Example 65

This example includes the elements of example 55, wherein N1 is equal to eight and N2 is equal to thirteen.

Example 66

According to this example, there is provided a system. The system includes at least one device arranged to perform the method of any one of examples 14 to 26.

Example 67

According to this example, there is provided a device. The device includes means to perform the method of any one of examples 14 to 26.

Example 68

According to this example, there is provided a computer readable storage device. The device has stored thereon instructions that when executed by one or more processors result in the following operations including: the method according to any one of examples 14 through 26.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A memory controller circuitry comprising:
a timestamp circuitry to capture a timer index from a timer having a granularity; the timestamp circuitry further to fetch a timestamp for a memory block that includes a group of sub-blocks that includes a target sub-block;
mode swap circuitry to identify a first composite count and a second compressed count;

a demarcation voltage (VDM) selection circuitry to fetch a combined count from a count store, the combined count representing a combined state, the combined state comprising a target individual state of the target sub-block and a respective individual state of each of at least one other sub-block of the group of sub-blocks included in the memory block; and reduction/expansion circuitry to expand the first composite count to a corresponding first composite state;

wherein:

the VDM selection circuitry is to fetch the first composite count and the second compressed count; and the mode swap circuitry is to convert the second compressed count to a second composite state and to set the target individual state of the target sub-block to zero in response to a write request to the target sub-block, if the timestamp is not equal to the timer index.

2. The memory controller circuitry of claim 1, wherein the VDM selection circuitry is to determine an elapsed time based, at least in part, on the timer index, the timestamp and the target individual state.

3. The memory controller circuitry of claim 1, further comprising a reduction/expansion circuitry to expand a composite count into a composite state, the composite count comprising a number N2 bits, the composite state comprising a number N1 trits, the target individual state corresponding to one trit of the N1 trits, N2 less than 2*N1.

4. The memory controller circuitry of claim 2, wherein the VDM selection circuitry is to determine the elapsed time in response to a read request for the target sub-block and to select a first demarcation voltage (VDM1) if the elapsed time is less than the granularity or a second demarcation voltage (VDM2) if the elapsed time is greater than or equal to the granularity.

5. The memory controller circuitry of claim 1, wherein the VDM selection circuitry is to set the target individual state of the target sub-block to zero in response to a write to the target sub-block.

6. The memory controller circuitry of claim 5, wherein, if the timer index is not equal to the timestamp, the VDM selection circuitry is to increment an other trit in the composite state in response to the write to the target sub-block if the other trit is less than two and the timestamp circuitry is to associate the captured timer index with the memory block and store the captured timer index to a timestamp store.

7. The memory controller circuitry of claim 1, wherein the VDM selection circuitry is to update a trit if the trit is less than two, the reduction/expansion circuitry is to reduce the second composite state to a second composite count and the mode swap circuitry is to convert the first composite state to a first compressed count.

8. A method comprising:

capturing, by a timestamp circuitry, a timer index from a timer having a granularity;

fetching, by the timestamp circuitry, a timestamp for a memory block that includes a group of sub-blocks that includes a target sub-block;

fetching, by a demarcation voltage (VDM) selection circuitry, a combined count from a count store, the combined count representing a combined state, the combined state comprising a target individual state of the target sub-block and a respective individual state of each of at least one other sub-block of the group of sub-blocks included in the memory block;

identifying, by mode swap circuitry, a first composite count and a second compressed count;

fetching, by the VDM selection circuitry, the first composite count and the second compressed count;

expanding, by reduction/expansion circuitry, the first composite count to a corresponding first composite state;

converting, by the mode swap circuitry, the second compressed count to a second composite state; and setting, by the mode swap circuitry, the target individual state of the target sub-block to zero in response to a write request to the target sub-block, if the timestamp is not equal to the timer index.

9. The method of claim 8, further comprising determining, by the VDM selection circuitry, an elapsed time based, at least in part, on the timer index, the timestamp and the target individual state.

10. The method of claim 8, further comprising expanding, by a reduction/expansion circuitry, a composite count into a composite state, the composite count comprising a number N2 bits, the composite state comprising a number N1 trits, the target individual state corresponding to one trit of the N1 trits, N2 less than 2*N1.

11. The method of claim 9, further comprising determining, by the VDM selection circuitry, the elapsed time in response to a read request for the target sub-block and selecting, by the VDM selection circuitry, a first demarcation voltage (VDM1) if the elapsed time is less than the granularity or a second demarcation voltage (VDM2) if the elapsed time is greater than or equal to the granularity.

12. The method of claim 8, further comprising setting, by the VDM selection circuitry, the target individual state of the target sub-block to zero in response to a write to the target sub-block.

13. The method of claim 12, further comprising, if the timer index is not equal to the timestamp, incrementing, by the VDM selection circuitry, an other trit in the composite state in response to the write to the target sub-block if the other trit is less than two; associating, by the timestamp circuitry, the captured timer index with the memory block; and storing, by the timestamp circuitry, the captured timer index to a timestamp store.

14. The method of claim 8, further comprising updating, by the VDM selection circuitry, a trit if the trit is less than two; reducing, by the reduction/expansion circuitry, the second composite state to a second composite count; and converting, by the mode swap circuitry, the first composite state to a first compressed count.

15. A time tracking system comprising:

a processor circuitry;

a memory array comprising a plurality of memory blocks;

a memory circuitry comprising a count store and a timestamp store; and a memory controller comprising:

a timestamp circuitry to capture a timer index from a timer having a granularity;

the timestamp circuitry further to fetch a timestamp for a memory block that includes a group of sub-blocks that includes a target sub-block;

mode swap circuitry to identify a first composite count and a second compressed count;

a demarcation voltage (VDM) selection circuitry to fetch a combined count from the count store, the combined count representing a combined state, the combined state comprising a target individual state of the target sub-block and a respective individual state of each of at least one other sub-block of the group of sub-blocks included in the memory block; and reduction/expansion circuitry to expand the first composite count to a corresponding first composite state; wherein:

the VDM selection circuitry is to fetch the first composite count and the second compressed count; and the mode swap circuitry is to convert the second compressed count to a second composite state and to set the target individual state of the target sub-block to zero in response to a write request to the target sub-block, if the timestamp is not equal to the timer index.

16. The time tracking system of claim 15, wherein the VDM selection circuitry is to determine an elapsed time based, at least in part, on the timer index, the timestamp and the target individual state.

17. The time tracking system of claim 15, further comprising a reduction/expansion circuitry to expand a composite count into a composite state, the composite count comprising a number N2 bits, the composite state comprising a number N1 trits, the target individual state corresponding to one trit of the N1 trits, N2 less than 2*N1.

18. The time tracking system of claim 16, wherein the VDM selection circuitry is to determine the elapsed time in response to a read request for the target sub-block and to select a first demarcation voltage (VDM1) if the elapsed time is less than the granularity or a second demarcation voltage (VDM2) if the elapsed time is greater than or equal to the granularity.

19. The time tracking system of claim 15, wherein the VDM selection circuitry is to set the target individual state of the target sub-block to zero in response to a write to the target sub-block.

20. The time tracking system of claim 19, wherein, if the timer index is not equal to the timestamp, the VDM selection circuitry is to increment an other trit in the composite state in response to the write to the target sub-block if the other trit is less than two and the timestamp circuitry is to associate the captured timer index with the memory block and store the captured timer index to a timestamp store.

21. The time tracking system of claim 15, wherein the VDM selection circuitry is to update a trit if the trit is less than two, the reduction/expansion circuitry is to reduce the second composite state to a second composite count and the mode swap circuitry is to convert the first composite state to a first compressed count.

* * * * *